United States Patent [19]

Namavar et al.

[11] Patent Number: 5,436,499
[45] Date of Patent: Jul. 25, 1995

[54] HIGH PERFORMANCE GAAS DEVICES AND METHOD

[75] Inventors: Fereydoon Namavar, Westford; Nader M. Kalkhoran, Tewksbury, both of Mass.

[73] Assignee: Spire Corporation, Bedford, Mass.

[21] Appl. No.: 212,115

[22] Filed: Mar. 11, 1994

[51] Int. Cl.$^6$ .................. H01L 29/161; H01L 29/20; H01L 29/22; H01L 29/24
[52] U.S. Cl. .................... 257/617; 257/604; 257/147
[58] Field of Search ............ 257/617, 604, 608, 513, 257/509, 147, 524

[56] References Cited

U.S. PATENT DOCUMENTS

| | | | |
|---|---|---|---|
| 3,663,308 | 5/1972 | Davey | 257/524 |
| 3,707,765 | 1/1973 | Coleman | 257/524 |
| 3,897,273 | 7/1975 | Marsh et al. | 257/617 |
| 4,587,656 | 5/1986 | Hartman et al. | 257/506 |
| 4,596,208 | 6/1986 | Wolfson et al. | 118/712 |
| 4,693,760 | 9/1987 | Sioshansi | 148/4 |

OTHER PUBLICATIONS

Yin et al, "Improved Breakdown Voltage in GaAs . . .", IEEE E D Lttrs, vol. 11 #12, Dec. 1990, pp. 561–563.
Donald C. D'Avanzo, "Proton Isolation for GaAs Integrated Circuits", IEEE Transactions on Electron Device, vol. ED-29, No. 7, Jul. 1982 pp. 1051–1058.
J. P. Speight et al. "The Isolation of GaAs Microwave Device Using Proton Bombardment". pp. 275–287 Int'l. Phys. Conf. Sem. No. 33a, U.S., 1977.
M. R. Melloch et al. "Formation of Arsenic Precipitation in GaAs Buffer Layers Grown by Molecular Beam . . ." Appl. Phys. Lett. 57(15) 8 Oct. 1990 pp. 1531–1533.
A. C. Warren et al. "Arsenic Precipitates and the Semi--Insulated Proper. of GaAs Buffer Layers Grown by Low-Temp . . . ", Appl. Phys. Lett. 57(13), 24 Sep. 1990 pp. 1331–1333.
F. W. Smith et al. "New MBE Buffer Used to Eliminate Backgating in GaAs MESFET's." IEEE Elector Device Letters, vol. 9, No. 2 Feb. 1988 pp. 77–80.
M. J. Delaney et al. "Low-Temperat. Buffer GaAs MESFET Techol. for High-Speed Integr. Circuit Applic" IEEE Electron Device Letters vol. 10, No. 8, Aug. 1989 pp. 355–357.
M. Kaminska et al "Structural Properties of As-rich GaAs Grown by Molecular Beam Epitaxy at Low Temperature" Appl. Phys. Lett. 54(19), 8 May 1989 pp. 1881–1883.
Robert J. Trew et al. "Gate Breakdown in MESFETS and HEMT's." IEEE Electron Device Letters vol. 12, No. 10 Oct. 1991 pp. 524–526.

(List continued on next page.)

Primary Examiner—Sara W. Crane
Assistant Examiner—Stephen D. Meier
Attorney, Agent, or Firm—Morse, Altman, Dacey & Benson

[57] ABSTRACT

High performance GaAs and AlGaAs-based devices and a process enabling the manufacture of new III-V compound technologies are disclosed. The GaAs devices are particularly useful as VLSICs by possessing a high degree of electrical insulation, both vertical and lateral, between closely packed active devices. Essentially, the GaAs devices include a substrate on which is formed, preferably by epitaxial growth or by ion implantation, an active GaAs, or AlGaAs region incorporating, by appropriate doping, the simultaneously therein formed active segments. The active segments are electrically shielded by providing insulating stratums in the active GaAs, AlGaAs region surrounding the active segments. Preferably, the insulating stratums are formed therein by implanting arsenic ions therein so as to form arsenic precipitates. Preferably, a passivated surface layer also is formed in part of the surface of the GaAs, AlGaAs active layer, also preferably by implanting arsenic ions therein. Following implantation, the GaAs, AlGaAs devices are annealed in a reactor preferably at a temperature of about 600° C. in an arsine ambient gas for a period of about 10 minutes.

10 Claims, 3 Drawing Sheets

OTHER PUBLICATIONS

M. Kaminska et al. "Stoichiometry-related Defects in GaAs Grown by Molecular-Beam Epitaxy" *J. Vac. Sci. Technol.* B7(4), Jul./Aug., 1989 pp. 710–713.

M. Kaminska et al "Structural Properties of As-rich GaAs Grown by Molecular Beam Epitaxy at Low T" *Appl. Phys. Lett.* 54(19), 8 May, 1989, pp. 1881–1883.

Eun Kyu Kim, et al. "Hydrogenation Effect on Electrical and Optical Properties of GaAs Epilayers Grown on . . . " *Appl. Phys. Lett.* 58(21), 27 May 1991, pp. 2405–2407.

Herbert Goronkin et. al. "Backgating and Light Sensitive in Ion-Impanted GaAs Integrated Circuit" *IEEE Transactions on Electron Devices,* vol. ED–29, No. 5, May, 1982, pp. 845–850.

Christopher Kocot et al "Backgating in GaAs MESFET" *IEEE Transactions of Elect Dev.* vol. ED–29, No. 7 Jul. 7, 1982, pp. 1059–1064.

Hoon Young Cho et al. "A Relation Between Eld-/$E_c$–081eV . . . HB–GaAs By Hydrogen Plasma Exposure" *J. Appl Phys.* 66(7)1 Oct., 1989, pp. 3039–3041.

R. J. Matyi "High Resolution X–Ray Diffraction Analysis of Annealed Low–Temp. Gallium Arsenide" *App. Phys. Lett.* 60(21) 25 May 1992 pp. 2642–2644.

Hoon Young Cho et al. "Creation of Deep Levels in Horizontal Bridgment–Grown GaAs Cy Hydrogenation" *Appl. Phys. Lett.* 53(10), 5 Sep. 1988 pp. 856–858.

A. Claverie et al. "Formation of As Precipitates GaAs by Ion Implantation of Thermal Annealing" *Appl. Phys. Lett.* 62(11), 15 Mar., 1993 pp. 1271–1273.

Zuzanna Lili et al–Weber et al "Breakdown of Crystal Unity of Low–Temp–Grown GaAs Layers" *Appl. Phys. Lett* 58(19), 13 May, 1991 pp. 2153–2155.

S. J. Pearton et al "Hydrogen in Crystalline Semiconductors" *App. Phys. A 43,* 153–195 (1987) pp. 154–195.

HIGH PERFORMANCE GAAS DEVICES AND METHOD

The Government of the United States has certain rights in this invention.

BACKGROUND OF THE INVENTION

1. Field of the Invention

The present invention relates generally to high performance GaAs and AlGaAs-based devices useful, in particular, as VLSICs, which devices possess a high degree of vertical and lateral electrical insulation between densely packed active devices and, more particularly, to a GaAs, AlGaAs device whose active region is surrounded by insulating stratums containing densely packed arsenic precipitates.

2. The Prior Art

The size of our federal budget and the size of what that budget buys in part do not always go in the same direction. For such is the case of electronic components required by our defense and space establishments as well as by our commercial enterprises. While the budgets balloon, electronic components continue to shrink in size to the micron and indeed to the sub-micron levels. In the field of electronics, miniaturization is the key.

The design and manufacture of integrated circuits (ICs) have long passed from medium to large-scale and to the very large scale size. Today's very-large-scale integrated circuits (VLSICs) pack densely their more than 20,000 logic gates or more than 64,000 bits of memory integrated with a single semiconductor substrate or deposited on the substrate by a continuous series of compatible processes. We are thus down to the micron and submicron sizes as regards the individual active devices integrated on a single chip. In order for such multiple-function chip circuit to function properly, not only must they possess good thermal stability, but there must exist a high degree of electrical isolation between the closely packed active devices. In the absence of a high degree of electrical isolation between and among the densely packed active devices, pernicious cross-talk occurs between neighboring devices. Such cross-talk renders the particular chip circuit utterly useless for its intended use involving space and defense applications as well as commercial applications.

Consequently, for a proposed design and manufacture of such a VLSIC to be acceptable for its intended purposes, a high degree of electrical isolation must be achieved between the densely-packed neighboring active devices. A great number of microelectronic and optoelectronic chips today are made of gallium arsenide (GaAs) and other III-V compound materials. These materials are widely used, inter alia, in the design and manufacture of field effect transistors (FETs) and lasers.

In the design of large-scale integrated circuits (LSICs), containing about a thousand active devices separated by about 3 microns on a single chip, mesa etching had been used to achieve acceptable electrical isolation between the devices. The typical breakdown voltage achieved was about 5 V. For most commercial applications this is acceptable. For defense and space applications however, much higher breakdown voltages are required.

Recently, GaAs layers grown by molecular-beam epitaxy (MBE) at very low substrate temperatures have gained considerable interest as buffer layers for GaAs metal-semiconductor field effect transistors (MESFETs) due to their high resistivity and excellent device isolations. See F. W. Smith et al, "New MBE Buffer Used to Eliminate Backgating in GaAs MESFET'S," IEEE Electron Device Letters, Vol.9, No. 2, February 1988. Although the low temperature (LT) MBE process has materially improved the device performance of GaAs circuits, it is both complex and expensive. Furthermore, the achieved buffer layers produced by LT-MBE are not readily controllable and at times incompatible with existing GaAs technology. The achieved resistivity of such buffer layers produced by LT-MBE also approaches currently acceptable minimum levels and may well be below requirements yet to come.

Other researchers in the field have succeeded in creating high resistivity buffer layers in GaAs integrated circuits by proton bombardment. See Donald C. D'Avanzo, "Proton Isolation for GaAs Integrated Circuits," IEEE Transactions on Electron Devices, Vol. ED 29, No. 7, July 1982; and J. D. Speight et al., "The Isolation of GaAs microwave devices using proton bombardment," Inst. Phys. Conf., Ser. No. 33 a, 1977, Ch. 5.

In the proton bombardment, the crystallinity of the bombarded area is destroyed, producing a semi-insulating layer. The effect is temporary, however, since over time the proton bombarded layer recrystallizes, thereby nullifying the isolation effect.

Hence, there exists a need for a submicron compatible technology to fabricate GaAs based VLSICs with higher effective packing densities than currently possible.

SUMMARY OF THE INVENTION

It is a principal object of the present invention to overcome the aforementioned disadvantages by providing high performance GaAs devices that possess a high degree of vertical and lateral isolation between densely packed active devices and a process enabling the manufacture of new III-V compound semiconductor technologies.

More particularly, it is an object of the present invention to provide a high performance GaAs, AlGaAs device useful, in particular, as VLSIC by possessing a high degree of electrical isolation, both vertical and lateral, between closely packed active devices, and a dependable and economic process enabling the manufacture of III-V compound technologies suitable for submicron device manufacturing. The resultant devices effectively eliminate backgating or sidegating effects and consequent pernicious cross-talk between and among neighboring devices. Heretofore existing limitations on device-packing density have, as a result, been overcome.

The high performance GaAs device of the invention essentially comprises a GaAs, AlGaAs, AlGaAs-on-GaAs, Ge, GaAs-on-Ge, Si, GaAs-on-Si, GaAs-on-Ge-on-Si, and Silicon-on-Insulator or GaAs on Silicon-on-Insulator substrate; a GaAs and/or AlGaAs active region epitaxially grown or formed using other methods such as ion implantation and diffusion doping on the substrate, the active region simultaneously incorporating therein by appropriate doping the desired active segments of the device; forming a number of insulating stratums in the GaAs active region, with the stratums surrounding the active elements and providing thereby both lateral and vertical electrical insulation to the device; the stratums being formed by implanting arsenic ions into the GaAs active region, followed by anneal; the implanted arsenic ions forming a plurality of arsenic precipitates. Preferably, a passivated surface layer also is formed, also preferably by arsenic ion implantation, in a portion of the GaAs active region's surface in operative association with at least one of the device's active segments. Preferably, the GaAs device is one of a group comprising MESFET's, HEMT's, MISFET's, inverter circuits and tunable wavelength vertical cavity emitting lasers. Preferably, the insulating stratums exhibit a flat current-voltage (I-V) characteristic, i.e., negligible current flows, for applied voltages lower than the limit set for device operation.

The high resistivity GaAs materials fabricated using ion implantation typically contain an excess arsenic between 1-1.5 atomic percent. Depending on the postimplant annealing conditions, arsenic precipitates of varying sizes are formed in the GaAs material which render it highly resistive. Electrical characterizations have revealed that these materials have an electrical resistivity of at least $10^6$ ohms-cm and can withstand breakdown electric fields of greater than $1 \times 10^5$ MV/cm.

Other objects of the present invention will in part be obvious and will in part appear hereinafter.

The invention accordingly comprises the product and method of the present disclosure, its components, parts and their interrelationship, the scope of which will be indicated in the appended claims.

BRIEF DESCRIPTION OF THE DRAWINGS

For a fuller understanding of the nature and objects of the present invention, reference is to be made to the following detailed description, which is to be taken in connection with the accompanying drawings, wherein.

DETAILED DESCRIPTION OF THE PREFERRED EMBODIMENTS

Figure 1:
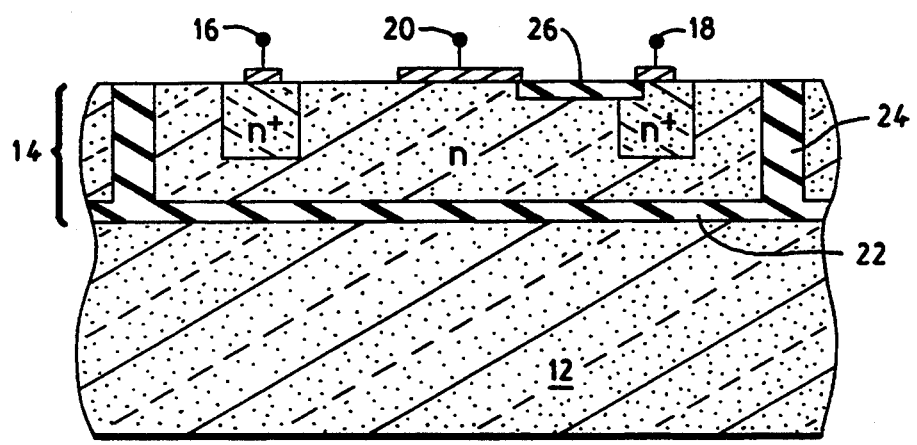
FIG. 1 is a schematic elevational section, on an enlarged scale, of a representative high performance GaAs, AlGaAs device, a MESFET, constructed in accordance with and embodying the present invention.

In general, the present invention pertains to high performance GaAs and AlGaAs-based devices useful, inter alia, as VLSICs, which devices possess a high degree of vertical and lateral electrical insulation between densely packed active devices and, more particularly, to a GaAs, or AlGaAs device whose active region is surrounded by insulating stratums containing densely packed arsenic precipitates.

As known, today's very-large-scale integrated circuits (VLSICs) pack densely their more than 20,000 logic gates or more than 64,000 bits of memory integrated with a single semiconductor substrate or deposited on the substrate by a continuos series of compatible processes. We are thus dealing with submicron sizes. In order for such multiple-function chip circuit to function properly, they must possess good thermal stability. In addition, there must exist a high degree of electrical isolation between the closely packed active devices. For in the absence of a high degree of electrical isolation between and among the densely packed active devices, pernicious cross-talk occurs between neighboring devices. Such cross-talk of course renders the particular chip circuit utterly useless for its intended use.

In general, the high performance GaAs and AlGaAs devices of the invention include a substrate with an active GaAs or AlGaAs region. This active GaAs or AlGaAs region incorporates by appropriated doping, the simultaneously therein formed active segments of the device. The active segments are electrically shielded by providing insulating stratums in the active GaAs, AlGaAs region surrounding the active segments. Preferably, these insulating stratums are formed in the GaAs, AlGaAs active region by implanting arsenic ions therein so as to form arsenic precipitates.

Ion implantation is, by now, a well-known process. The common assignee herein, Spire Corporation of Bedford, Mass., has been one of the pioneers in working with ion beams. For example, among others, it has patented an ion beam coating apparatus (U.S. Pat. No. 4,440,108), a plasma ion deposition process (U.S. Pat. No. 4.443,488), a process for preventing surface discoloration in orthopaedic implants (U.S. Pat. No. 4,693,760), a process for the ion implantation of plastics (U.S. Pat. No. 4,743,493), a process of treating metal alloys to inhibit corrosion (U.S. Pat. No. 4,743,308), a sputter-enhanced ion implantation process (U.S. Pat No. 4,855,026), and a method and apparatus for ion implanting spherical surfaces (U.S. Pat. No. 4.872,922). See also U.S. Pat. Nos. 4,968,006 and 5,098,483, disclosing improved methods, including ion implantation, for the treatment of spherical surfaces, also assigned to Spire Corporation, Bedford, Mass., the common assignee herein.

It is fair to say, therefore, that Spire Corporation, the common assignee, has acquired expertise in the field of ion implantation.

Ion implantation of arsenic ions as disclosed herein for the fabrication of high performance GaAs, AlGaAs devices with no backgating or sidegating effects is equally applicable to the fabrication of novel III-V compound technologies, as will become evident to those skilled in the art. The process of forming high performance GaAs and AlGaAs-based devices according to the invention essentially includes the steps of forming a substrate of GaAs, AlGaAs, AlGaAs-on-GaAs, Ge, GaAs-on-Ge, Si, GaAs-on-Si, GaAs-on-Ge-on-Si, and Silicon-on-Insulator or GaAs Silicon-on-Insulator material, forming an active GaAs or AlGaAs region on the substrate and simultaneously forming therein the active segments of the device by appropriate doping, forming insulating stratums in the active GaAs, AlGaAs region surrounding, both vertically and laterally, the active segments thereof by implanting arsenic ions therein, and annealing the ion implanted device in a reactor in an ambient arsine (AsH3) gas for at least about 10 minutes so as to form a plurality of arsenic precipitates therein.

The implantation of arsenic ions into the active GaAs region preferably is effected in a suitable implant chamber of a suitable high current ion implanter, as for example the one illustrated in U.S. Pat. No. 4,693,760 that issued Sep. 15, 1987 to Piran Sioshansi and assigned to the common assignee, Spire Corporation, Bedford, Mass., the disclosure of which is incorporated herein by reference. The implantation of the arsenic ions into the GaAs, AlGaAs active region is effected preferably through a lithographically or physically patterned mask. The arsenic ions are implanted with doses ranging from about $1 \times 10^{15}$ to about $1 \times 10^{17}$ As+ /cm$^2$ at energies ranging from about 50 keV to about 3 MeV.

Following the arsenic ion implantation, the implanted devices are annealed at about 600° C. in an ambient arsine gas for a time period of at least about 10 minutes, but not exceeding about 30 minutes. Annealing preferably is effected in a metalorganic chemical vapor deposition (MOCVD) reactor, as for example the one disclosed in U.S. Pat. No. 4,596,208 that issued Jun. 24, 1986 to Robert G. Wolfson et al. and assigned to the common assignee, Spire Corporation, Bedford, Mass., the disclosure of which also is incorporated herein by reference.

The arsenic ion implantation and annealing procedures ensure that arsenic-rich insulating stratums, having a plurality of dispersed arsenic precipitates therein, are formed in the active GaAs, AlGaAs region. These insulating stratums serve as electrical insulating walls to the active segments of the GaAs, AlGaAs device, providing both lateral and vertical isolation to the device and effectively eliminating thereby backgating and sidegating effects.

As known, "backgating" occurs in a GaAs integrated circuit when a negatively biased ohmic-contacted n-type region is in close proximity to an operating device, such as a MESFET. As the negative bias increases, the depletion region at the interface between the MESFET and the semi-insulating substrate widens, resulting in a reduction in drain current. In instances when significant backgating occurs, the dc characteristics of the MESFET depend not only on the internal device biases but also on the proximity of negative voltage lines. Otherwise normally straightforward design considerations of MESFET's, such as dc operating points and required matching between devices thus become layout dependent, resulting in severe design complications.

In FIGS. 1-6, there are illustrated, in schematic elevational section and on an the enlarged scale, various representative high performance GaAs devices, each constructed in accordance with and embodying the present invention.

In FIG. 1 there is illustrated a metal semiconductor field-effect-transistor (MESFET) 10 comprising a substrate 12, formed of one of the following: GaAs, AlGaAs, AlGaAs-on-GaAs, Ge, GaAs-on-Ge, Si, GaAs-on-Si, GaAs-on-Ge-on-Si, and Silicon-on-Insulator or GaAs on Silicon-on-Insulator; a GaAs or AlGaAs active region 14 grown, preferably epitaxially, on the substrate 12 incorporating the active segments of the device. These active segments, preferably applied by front surface metallization, include two ohmic contacts 16 and 18, one serving as a source and the other as a drain, separated by a gate 20. A first insulating stratum 22 is formed, as above described, in the GaAs, AlGaAs active region 14 adjacent the substrate 12, designed to prevent backgating. A second insulating stratum 24 also is formed, as above described, in the GaAs, AlGaAs active region 14 surrounding the active segments 16, 18 and 20 thereof and designed to prevent sidegating. Preferably, a third insulating stratum 26 also is formed, as above described, in a portion of the surface of the GaAs active region 14 and between one 18 of the ohmic contacts and the gate 20 in order to provide surface passivation to the device 10, eliminating thereby problems associated with gate-to-drain leakage.

Each of these insulating stratums 22, 24 and 26 features a plurality of arsenic precipitates.

Figure 2:
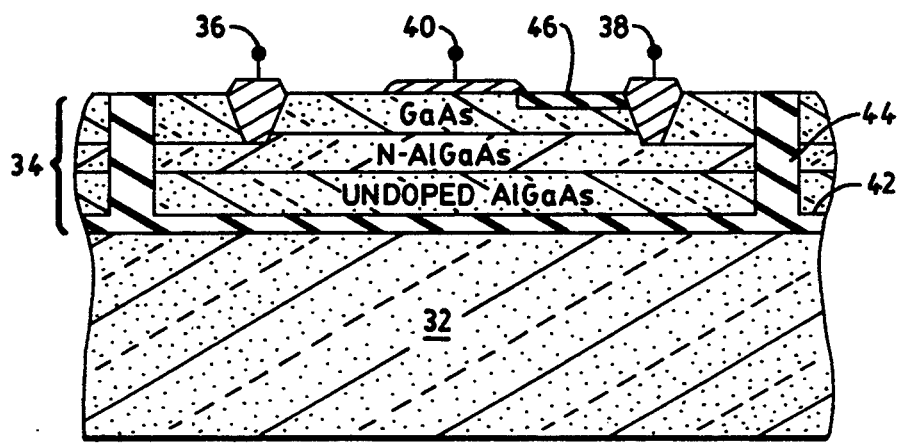
FIG. 2 is a view similar to FIG. 1 but illustrating another representative high performance GaAs, AlGaAs device, an HEMT, constructed in accordance with and embodying the present invention.

In FIG. 2, there is illustrated a high electron mobility transistor (HEMT) 30 comprising a substrate 32, a multi-layer GaAs, AlGaAs active region 34 epitaxially grown on the substrate 32 and incorporating the further active segments, namely two ohmic contacts 36 and 38 and a gate 40. Insulating stratums 42, 44 and 46 containing a plurality of arsenic precipitates, formed as above discussed, provide a high breakdown voltage device 30, with surface passivation and no backgating and sidegating effects.

Figure 3:
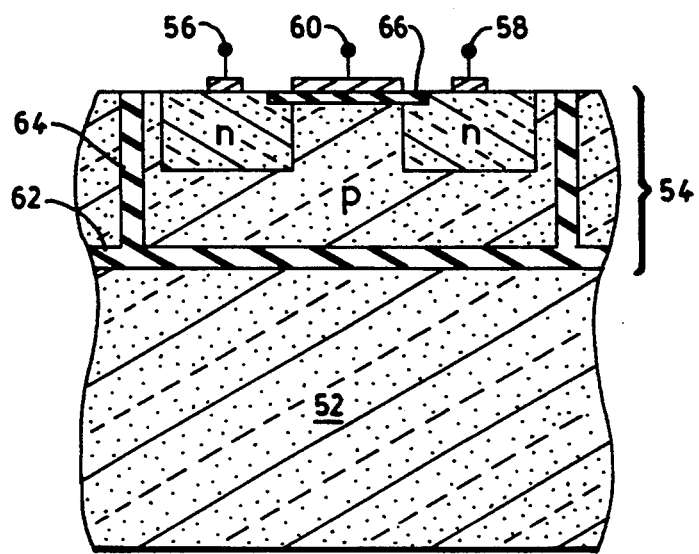
FIG. 3 is a view similar to FIG. 1 and illustrating another high performance GaAs, AlGaAs device, a MISFET, constructed in accordance with and embodying the present invention.

In FIG. 3, there is illustrated a metal insulator field-effect-transistor (MISFET) 50 comprising a substrate 52, a GaAs, AlGaAs active region 54 grown on the substrate 52, active segments, including ohmic contacts 56 and 58 and a gate 60, and insulating stratums 62, 64 and 66 formed in the active region 54, as shown. The insulating stratums 62, 64 and 66 include arsenic precipitates, in dimensions and with concentration densities as above described. The insulating stratums 62 and 64 provide the device 50 with anti-backgating and sidegating effects, and the insulating stratum 66 provides a gate insulator thereto.

Figure 4:
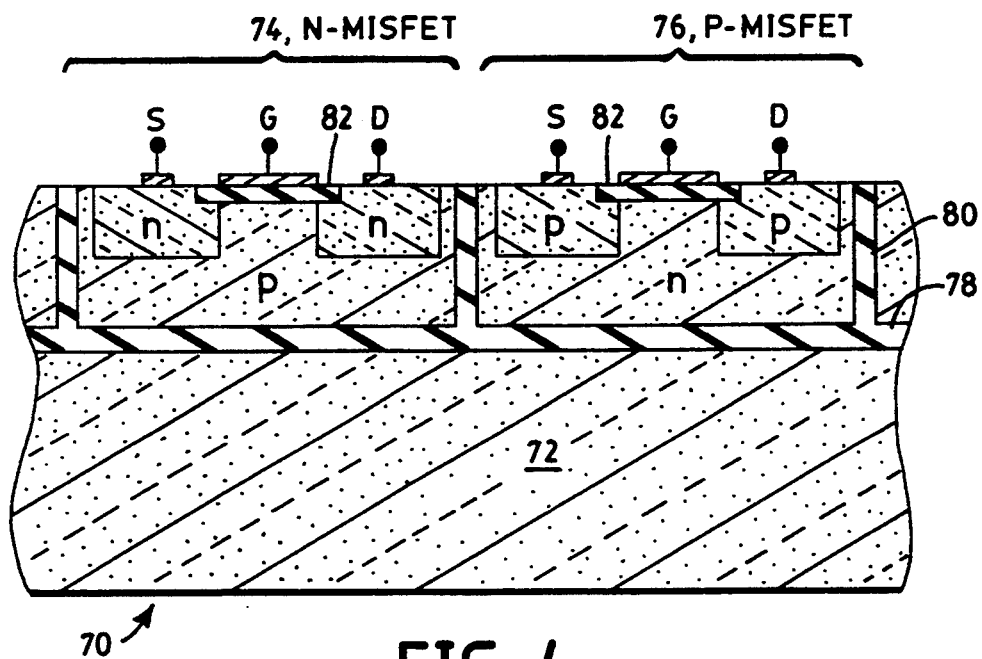
FIG. 4 is a view similar to FIG. 1 and illustrating another high performance GaAs, AlGaAs device, an inverter circuit with n- and p-channel MISFET's.

In FIG. 4, there is illustrated a GaAs inverter circuit 70 developed as a complementary metal-insulator semiconductor (CMIS) device, grown on a GaAs, AlGaAs substrate 72, with adjacent n- and p-channel MISFETs 74 and 76, and enabled by arsenic-implanted insulating stratums 78, 80 and 82, to provide anti-backgating and anti-sidegating effects and gate insulators, respectively.

Figure 5:
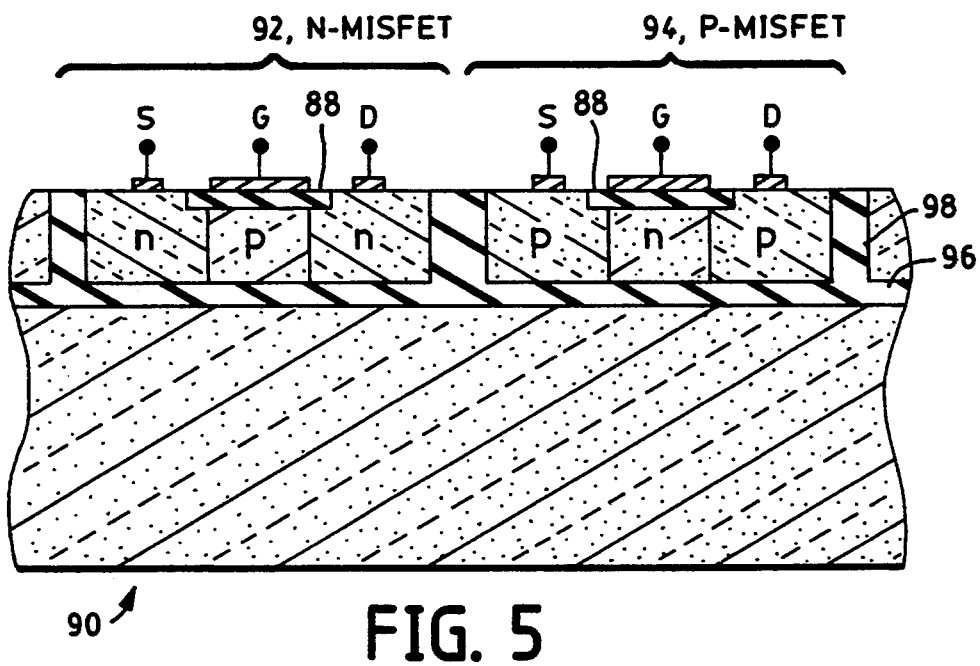
FIG. 5 is a view similar to FIG. 1 and illustrating another high performance GaAs, AlGaAs device, fully depleted MISFET's fabricated on a thin GaAs-based semiconductor-on-insulator (SOI) stratum.

In FIG. 5, there is illustrated a GaAs, AlGaAs fully depleted inverter circuit 90 fabricated on thin III-V compound-based semiconductor-on-insulator (SOI) structure, also developed as a CMIS device, with adjacent n- and p-channel MISFET's 92 and 94, and enabled by arsenic-implanted insulating stratums 96, 98 and 88, to provide anti-backgating and anti-sidegating effects and gate insulators, respectively. As known, CMIS technology is analogous to the advanced silicon-based CMOS technology, but excels thereover in higher radiation hardness and operation speeds.

Figure 6:
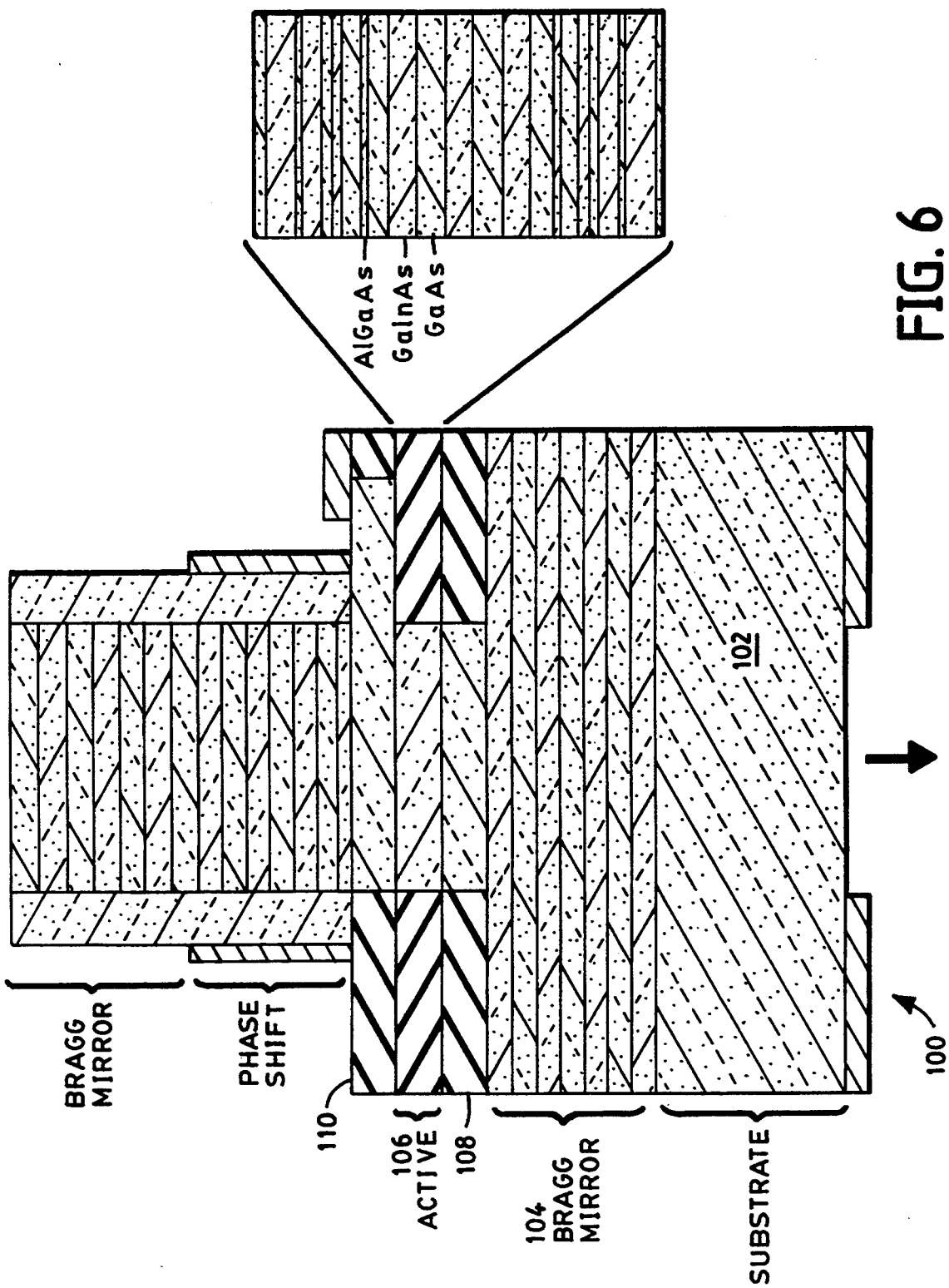
FIG. 6 is a schematic elevational section, on an enlarged scale, of a tunable wavelength vertical cavity emitting laser element constructed in accordance with and embodying the present invention.

In FIG. 6, there is illustrated a tunable wavelength vertical cavity emitting laser element 100 comprising a GaAs based substrate 102, on which is grown, in succession, a Bragg mirror structure 104, a GaAs based active region 106 sandwiched between a pair of arsenic-implanted insulating stratums 108 and 110.

Thus it has been shown and described novel high performance GaAs devices and a process enabling the manufacture of new III-V compound technologies, which devices and process satisfy the objects and advantages set forth above.

Since certain changes may be made in the present disclosure without departing from the scope of the present invention, it is intended that all matter described in the foregoing specification or shown in the accompanying drawings, be interpreted in an illustrative and not limiting sense.

What is claimed is:

1. A III-V compound-based device comprising:
   (a) a substrate;
   (b) an active region grown on said substrate and incorporating the active segments of said device; and
   (c) an insulating stratum formed in said active region adjacent said substrate;
   (d) said stratum comprising a plurality of arsenic precipitates formed therein;
   (e) said plurality of arsenic precipitates containing an excess arsenic in a range from about one to about 1.5 atomic percent.

2. The device of claim 1 wherein said device is one of a group consisting of: MESFETs, HEMTs, MISFETs, inverter circuits and tunable wavelength vertical cavity emitting lasers.

3. The device of claim 1 wherein said substrate is one of a group cosisting of: a GaAs, AlGaAs, AlGaAs-on-GaAs, Ge, GaAs-on-Ge, Si, GaAs-on-Si, GaAs-on-Ge-on-Si, and Silicon-on-Insulator or GaAs on Silicon-on-Insulator substrate.

4. The device of claim 1 wherein said active region is an epitaxially grown layer.

5. The device of claim 1 wherein said active region is a GaAs region and further including side insulating stratums formed in part of the surface of said GaAs active region normal to said insulating stratum formed adjacent said substrate, said side insulating stratums surrounding said active segments of said device, and further including an insulating stratum formed in part of the surface of said GaAs active region and in operative association with at least one of said active segments of said device.

6. The device of claim 5 wherein said insulating stratum shields said device from backgating and sidegating effects for the entire length of use of said device by maintaining the drain current of said device constant despite the application of negative bias to its ohmic contact and by eliminating cross-talk with adjacently placed devices.

7. The device of claim 5 wherein each of said insulating stratums is formed in said device by implanting arsenic ions into said GaAs active region with an arsenic dose ranging from about $1 \times 10^{15}$ to about $1 \times 10^{17}$ As$^+$ions/cm$^2$ at energies between about 50 keV and 3 MeV, followed by annealing at about 600° C. in an ambient arsine gas for a time period of about 10 minutes.

8. A GaAs device for use as a very large scale GaAs integrated circuit, said device comprising:
   (a) a substrate formed of one of a group consisting of: a GaAs, AlGaAs, AlGaAs-on-GaAs, Ge, GaAs-on-GE, Si, GaAs-on-Si, GaAs-on-Ge-on-Si, Silicon-on-Insulator, and GaAs on Silicon-on-Insulator substrate;
   (b) an active region epitaxially grown on said substrate, said active region incorporating the active segments of said device;
   (c) insulating stratums formed in said active region and surrounding said active segments, said insulating stratums providing both lateral and vertical electrical insulation to said device to eliminate backgating and sidegating effects of said device;
   (d) said insulating stratums being formed by implanting excess arsenic ions in a range from about one to about 1.5 atomic percent into said active region, followed by anneal; and
   (e) a passivated surface layer formed in the surface of said active region in operative association with at least one of said active segments.

9. The GaAs device of claim 8 wherein said device is one of a group consisting of: MESFETs, HEMTs, MISFETs, inverter circuits and tunable wavelength vertical cavity emitting lasers.

10. The GaAs device of claim 8 wherein said implantation of arsenic ions is effected with a dose ranging from about $1 \times 10^{15}$ to about $1 \times 10^{15}$ As$^+$ ions/cm$^2$ at energies of at least about 180 keV, wherein said anneal is effected at a temperature of about 600° C. in an ambient arsine gas for a time period of about 10 minutes.

* * * * *

UNITED STATES PATENT AND TRADEMARK OFFICE
CERTIFICATE OF CORRECTION

PATENT NO.    : 5,436,499
DATED         : July 25, 1995
INVENTOR(S)   : Fereydoon Namavar and Nader M. Kalkhoran It is certified that error appears in the above-identified patent and that said Letters Patent is hereby corrected as shown below:

On the title page item [54], should read

-- HIGH PERFORMANCE GaAs DEVICES AND METHOD --

Signed and Sealed this

Thirty-first Day of October 1995

Attest:

BRUCE LEHMAN

Attesting Officer        Commissioner of Patents and Trademarks